United States Patent [19]

Mohr et al.

[11] Patent Number: 5,223,374
[45] Date of Patent: Jun. 29, 1993

[54] PROCESS FOR PREPARING A MULTICOLORED PROOF AND RADIATION-SENSITIVE RECORDING MATERIAL FOR USE IN THIS PROCESS

[75] Inventors: Dieter Mohr, Budenheim; Rudolf Zertani, Mainz; Juergen Mertes, Ingelheim; Martin Benzing, Mommenheim, all of Fed. Rep. of Germany

[73] Assignee: Hoechst Aktiengesellschaft, Frankfurt am Main, Fed. Rep. of Germany

[21] Appl. No.: 853,545

[22] Filed: Mar. 18, 1992

[30] Foreign Application Priority Data

Mar. 27, 1991 [DE] Fed. Rep. of Germany ....... 4110057

[51] Int. Cl.$^5$ .............................................. G03C 11/12
[52] U.S. Cl. ....................................... 430/257; 430/199; 430/258; 430/308; 430/293; 430/294; 430/330
[58] Field of Search ............... 430/293, 235, 358, 952, 430/199, 200, 201, 256, 257, 254, 258, 308, 294, 330

[56] References Cited

U.S. PATENT DOCUMENTS

| | | | |
|---|---|---|---|
| 2,679,498 | 5/1954 | Seven et al. | 534/564 |
| 3,050,502 | 8/1962 | Mellan | 528/236 |
| 3,721,557 | 3/1973 | Inoue | 430/257 |
| 3,867,147 | 2/1975 | Teuscher | 430/157 |
| 3,969,118 | 7/1976 | Stahlhofen et al. | 430/191 |
| 4,019,972 | 4/1977 | Faust | 430/283 |
| 4,101,323 | 7/1978 | Buhr et al. | 430/170 |
| 4,260,673 | 4/1981 | Krech | 430/143 |
| 4,304,836 | 12/1981 | Cheema et al. | 430/252 |
| 4,311,782 | 1/1982 | Buhr et al. | 430/270 |
| 4,356,253 | 10/1982 | Buzzell | 430/291 |
| 4,387,151 | 6/1983 | Bosse et al. | 430/175 |
| 4,489,153 | 12/1984 | Ashcraft et al. | 430/253 |
| 4,510,223 | 4/1985 | Kuehnle et al. | 430/44 |
| 4,587,198 | 5/1986 | Fisch | 430/201 |
| 4,705,739 | 11/1987 | Fisch | 430/276 |
| 4,869,993 | 9/1989 | Farahat et al. | 430/143 |
| 4,980,260 | 12/1990 | Shinozaki et al. | 430/138 |
| 4,983,498 | 1/1991 | Rode et al. | 430/284 |

FOREIGN PATENT DOCUMENTS

| | | |
|---|---|---|
| 163145 | 4/1985 | European Pat. Off. . |
| 0169049 | 1/1986 | European Pat. Off. . |
| 0236783 | 2/1987 | European Pat. Off. . |
| 277038 | 1/1988 | European Pat. Off. . |
| 320900 | 6/1989 | European Pat. Off. . |
| 0362827 | 4/1990 | European Pat. Off. . |
| 0411839 | 2/1991 | European Pat. Off. . |
| 3832032 | 3/1990 | Fed. Rep. of Germany . |
| 2374664 | 7/1978 | France . |
| 1143679 | 2/1969 | United Kingdom . |
| 2213950 | 8/1969 | United Kingdom . |
| 2096781 | 10/1982 | United Kingdom . |

OTHER PUBLICATIONS

English language abstract of JP 56-17284, Fujino et al. (Oriental Shashin Kogyo KK), Feb. 1981.

Primary Examiner—Charles L. Bowers, Jr.
Assistant Examiner—John A. McPherson
Attorney, Agent, or Firm—Foley & Lardner

[57] ABSTRACT

The present invention relates to a process for preparing a multicolored proof, using a radiation-sensitive recording material which comprises a temporary, sheet-shaped layer support, a thermally transferable layer containing a colorant in one primary color and a radiation-sensitive layer. The process comprises the steps of: a) exposing the recording material imagewise b)developing the exposed layer with an aqueous-alkaline solution to uncover the thermally transferable image areas, and c) contacting the coated side of the recording material with an image receptor and transferring the transferable image areas to the image receptor, with the application of heat and pressure, to produce a partial image in the first primary color. The above-described process steps are repeated at least once, using a radiation-sensitive recording material which contains a colorant in another primary color in its thermally transferable layer. Depending upon the respective embodiment, the process of the invention yields a proof which can be produced by a positive, a negative or a digital method, without distorting the image thus generated by interjacent layers.

5 Claims, 1 Drawing Sheet

PROCESS FOR PREPARING A MULTICOLORED PROOF AND RADIATION-SENSITIVE RECORDING MATERIAL FOR USE IN THIS PROCESS

BACKGROUND OF THE INVENTION

The present invention relates to a process for preparing a multicolored proof for the graphics industry and to a radiation-sensitive recording material which is suitable for use in this process and comprises, in general, a sheet-shaped temporary support, a thermally transferable layer containing a colorant and a radiation-sensitive layer disposed on top.

Color proofing is, in general, carried out in multicolor printing to permit corrections of the color separations used in exposing printing plates. The proof must be a consistent reproduction of the desired half-tone or line image and should neither increase nor reduce the tonal value of colors. Visual color proofing should reveal defects in the original, offer the best color rendition to be expected from press printing, produce the exact gradation of all color shades and indicate whether gray tones are neutral. It should furthermore indicate the need, if any, for subduing any of the colors and/or give directions for altering the film original before making the printing plate.

In multicolor printing, proofing has hitherto been made with the aid of colored press proofs. For this purpose, all the steps necessary in actual multicolor printing must be taken. A color proofing process of this kind is costly and time consuming. Other color proofing systems have therefore been developed, which are intended to have an equally good quality as press proofs.

To prepare color proofs which are consistent with the press prints to be made (print screen, color value similar to that of the printing ink) photochemically and electrophotographically working systems are, up to the present, the only systems which have found general acceptance.

Besides, there are physical methods of image generation, for example, ink jet, thermal transfer and thermal sublimation processes, which may give good colored images, but do not show a print screen and are therefore not comparable to color proofs which correspond exactly to the later press prints.

A great number of photochemically working color proofing systems are known in the art. The so-called "overlay systems", as described, for example, in GB-A 1,143,679 or U.S. Pat. No. 4,489,153, have the disadvantage that the proof is built up from four separate films by superposing partial images in the four primary colors and that, consequently, the impression gained from the image can be severely distorted by the inherent coloration of the films.

Further development in the field of color proofing led to composing an image on a support by way of several laminating steps. The final colored image is generated according to different methods. In the layer transfer processes, for example, according to U.S. Pat. No. 4,869,993 and EP-A 0 035 028 (=U.S. Pat. No. 4,260,673), the individual, unexposed layers are transferred to a support using an adhesive layer in each case and are there exposed and developed, one after the other.

In the image transfer systems as described, for example, in DE-A 19 12 864 (=U.S. Pat. No. 3,721,557) or DE-A 38 13 722 (=U.S. Pat. No. 4,980,260), exposure and development are carried out prior to the laminating step and the partial images in the primary colors are then composed on a support by means of an adhesive layer.

Processes are also known, in which uncolored photosensitive layers are laminated to a support, exposed under the individual color separations and optionally developed. In the process, differentiation between sticky and non-sticky layer areas occurs in the layer surface. A colorant powder is, in each case, adhered to the sticky layer areas to produce partial images in the corresponding primary colors. Processes of this kind are described, for example, in U.S. Pat. No. 4,356,253 or EP-A 0 320 900.

All the known laminating processes have the serious disadvantage that, irrespective of the fact that the proofs so produced come close to a printed image, the image reproduction is impaired by the presence of adhesive and/or polymer layers containing the image elements of the partial images in the primary colors embedded therein, as compared with a printed sheet, in which the individual ink dots are present directly on the printing substrate.

To overcome this disadvantage, EP-A 0 277 038, for example, describes a process, which comprises removing the polymer and/or adhesive layers present in the non-image areas in a developing step. In the image areas, however, the adhesive and/or polymer layers remain intact which, again, leads to an impaired image reproduction.

GB-A 2,213,950 describes a process which operates without adhesive layers. A photopolymerizable, dyed layer is exposed imagewise and then contacted with a printing substrate. Taking advantage of the difference in tackiness, the tacky dyed layer areas which have not been completely exposed are transferred to the printing substrate with the application of pressure and heat. This process has the disadvantage that its application is limited to photopolymer systems and, what is more, photosensitive layer and dyed layer are combined. It is therefore impossible to use photoinitiator systems which have an adequate absorption in the visible wavelength region.

Electrophotographically working color proofing systems which have recently been propagated and are described, for example, in U.S. Pat. No. 4,510,223 and EP-A 0 236 783 eliminate this deficiency, but require considerable expenditure for equipment and process and are thus very costly.

SUMMARY OF THE INVENTION

It is an object of the present invention to provide a process for preparing a multicolored proof and a radiation-sensitive recording material for use in this process which, depending on the particular embodiment, gives a multicolored proof which corresponds to the printed image and can be produced by a positive, a negative or a digital method on an image receptor, such as paper or any other suitable substrate, without distorting the image produced by any intermediate layers or colored photoinitiators.

This object is achieved by a process for preparing a multicolored proof, using a radiation-sensitive recording material which comprises a temporary, sheet-shaped layer support, a thermally transferable layer containing a colorant in one primary color and a radiation-sensitive layer, the process comprising the following process steps:

a) exposing the recording material imagewise,
b) developing the exposed layer with an aqueous-alkaline solution to uncover the thermally transferable image areas,
c) contacting the coated side of the recording material with an image receptor and transferring the transferable image areas to the image receptor, with the application of heat and pressure, to produce a partial image in the first primary color, and repeating the above-described process steps at least once, using a radiation sensitive recording material which contains a colorant in another primary color in its thermally transferable layer.

In a particularly preferred embodiment, the multicolored proof so prepared is transferred as a whole, with the application of heat and pressure, from the image receptor to a permanent image receptor, such that a true-to-side multicolored proof is obtained.

BRIEF DESCRIPTION OF THE DRAWINGS

The single figure is a diagrammatic representation of the process according to the present invention. A: temporary sheet-shaped support; B: colorant-containing, thermally transferable layer; C: radiation-sensitive layer; B, those areas of B which are uncovered following radiation exposure and development; D: image receptor; and E: permanent image receptor.

DETAILED DESCRIPTION OF THE PREFERRED EMBODIMENTS

Figure 1:
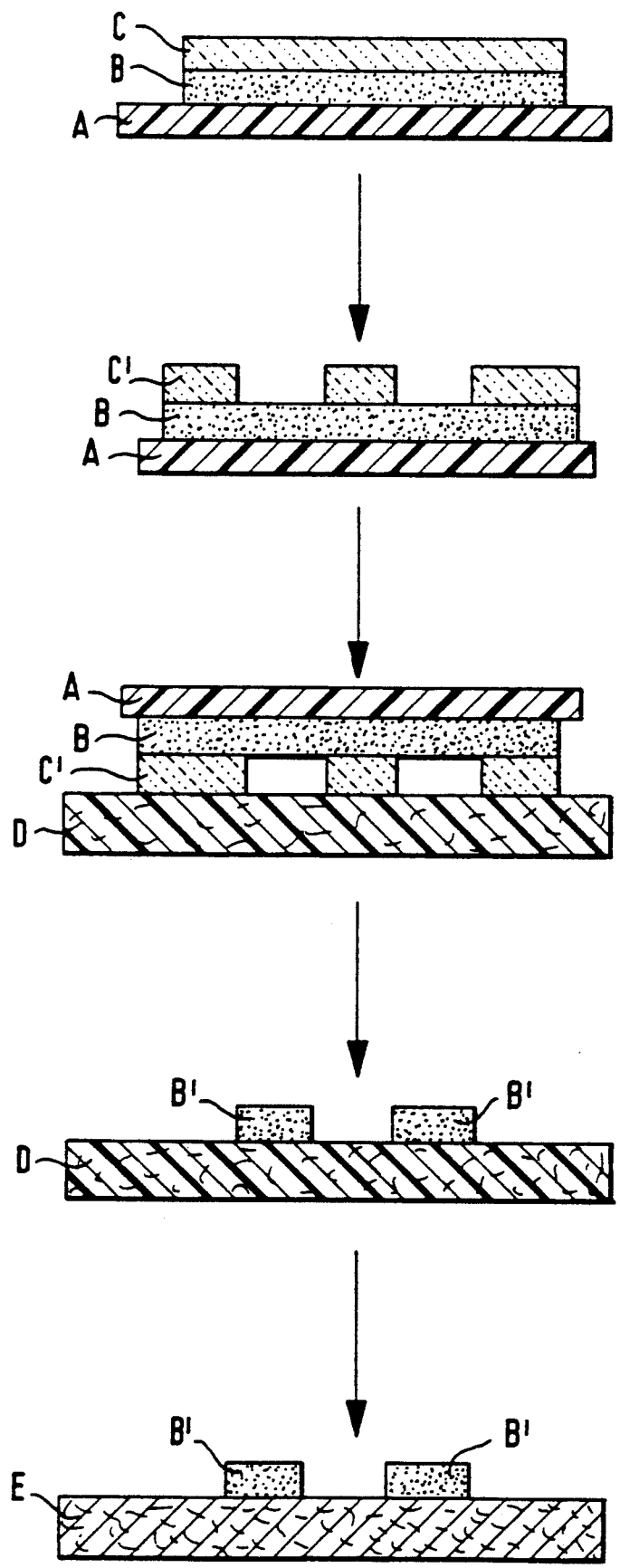

FIG. 1 is a diagrammatic representation of the process according to the present invention. In the drawing, A indicates the temporary sheet-shaped support. B is the colorant-containing, thermally transferable layer and C is the radiation-sensitive layer. Following exposure and development, those areas of B are uncovered (B') which are subsequently transferred with heat and pressure to the image receptor D, for example paper or a polyester film, to produce a partial image in the first primary color on D.

The same procedure is employed to produce, in register on top of the partial image (B') in the first primary color, for example cyan, successively partial images in the other colors, for example magenta, yellow and black. The resulting color proof is preferably transferred as a whole, with heat and pressure, to a permanent image receptor E, for example paper. An image which is true to side with respect to the original color separation is thus obtained.

The temporary sheet-shaped layer support A generally comprises a dimensionally stable and chemically resistant polyester film, in particular a polyethylene terephthalate film, which usually has a thickness of 25 to 250 $\mu$m and is preferably about 25 to 130 $\mu$m, in particular about 25 to 75 $\mu$m, thick. The film surface may be smooth or rough.

To adjust the interaction with the colorant-containing, thermally transferable layer B, the surface of the support film A can be treated or coated with an adhesion-promoting or adhesion-reducing agent, depending upon the chemical nature of B.

The colorant-containing, thermally transferable layer B comprises, in each case, a polymer and/or wax matrix and at least one dye or colored pigment of the colors cyan, magenta, yellow or black. This layer can additionally contain uv absorbers, antistatic agents, varnish additives and plasticizers.

Thermally transferable colored layers are known from the literature, for example EP-A 0 163 145. Color proofing by selective (image dot) heating is, for example, effected by "dye diffusion thermal transfer" or by transfer of the colored layer, for example, in the case of "thermal wax transfer". Layers of this kind can basically also be used for the color proofing process according to the present invention (transfer through image mask C' by means of an overall thermal treatment).

The polymer matrix of layer B can be formed of polymers comprising the following monomer components or combinations thereof:

Vinyl acetal of $C_1$ to $C_4$ aldehydes, vinyl esters of $C_2$ to $C_6$ carboxylic acids, acrylic acid and esters thereof with $C_1$ to $C_8$ alcohols, methacrylic acid and esters thereof with $C_1$ to $C_8$ alcohols, vinyl chloride, styrene, acrylonitrile, acrylamide of $C_1$ to $C_4$ amines, methacrylamide of $C_1$ to $C_4$ to amines, crotonic acid, butadiene, ethylene and propylene.

Further matrix-forming substances which can be used include cellulose derivatives, natural and synthetic waxes, as such or in the form of additives.

The binders of layer B are selected such that the softening range of the thermally transferable layer varies between about 50° and 150° C., preferably between about 50° and 100° C. and particularly preferably between about 50° and 90° C. To obtain specific properties, the above-indicated components can be added to the layer.

The colorant contained in layer B comprises at least one dye, preferably at least one colored pigment, which is homogeneously dispersed in the binder. To produce particular color shades, dyes or colored pigments of different tinges can be combined with one another. The mean particle size of the colored pigments used is not greater than about 1 $\mu$m.

The radiation-sensitive layer C can basically comprise any layer which, after irradiation (exposure), optionally followed by development and/or fixing, yields a surface in image configuration and which has a softening range at temperatures above 100° C, preferably above 150° C.

In addition to the layers containing silver halides, which are used in many fields, various other layers are also known, for example, colloid layers containing chromates and dichromates, layers containing unsaturated compounds, in which these compounds, upon exposure, are isomerized, rearranged, cyclized or crosslinked, layers containing photopolymerizable compounds, in which monomers or prepolymers are polymerized upon exposure, if appropriate with the aid of an initiator, and layers containing o-diazoquinones, such as naphthoquinone diazides, p-diazoquinones, or condensation products of diazonium salts. In addition to the photosensitive substances, these layers can also contain other constituents, such as binders, dyes or plasticizers.

In particular, the following radiation-sensitive or photosensitive compositions or compounds can be employed as the layer C of the recording materials according to the present invention:

positive-working reproduction layers which contain, as the photosensitive compounds, o-quinone diazides, preferably o-naphthoquinone diazides, such as 1,2-naphthoquinone-2-diazide-4 or 5-sulfonic acid esters or amides, which can have low or relatively high molecular weights, as described for example in DE-C 23 31 377 (=U.S. Pat. No. 3,969,118);

positive-working layers according to DE-A 26 10 842 (=U.S. Pat. No. 4,101,323) or DE-A 29 28 636 (=U.S. Pat. No. 4,311 782) containing a compound which, on being irradiated, splits off an acid, a monomeric or polymeric compound which has at least one C—O—C group which can be split off by acid, for example, an orthocarboxylic acid ester group or a carboxamideacetal group and, if appropriate, a binder;

negative-working layers composed of photopolmyerizable monomers, photoinitiators, binders and optionally further additives; in these layers, for example, acrylic and methacrylic acid esters or reaction products of diisocyanates with partial esters of polyhydric alcohols are employed as monomers, as described, for example in DE-A 23 61 041 (=U.S. Pat. No. 4,019,972);

negative-working layers according to DE-A 30 36 077 (=U.S. Pat. No. 4,387,151) which contain, as the photosensitive compound, a diazonium salt polycondensation product or an organic azido compound and, as the binder, a high-molecular weight polymer with alkenylsulfonylurethane or cycloalkenylsulfonylurethane side groups;

negative-working reproduction layers containing condensation products from aromatic diazonium salts and compounds with active carbonyl groups, preferably condensation products formed from diphenylaminediazonium salts and formaldehyde, which are described, for example in U.S. Pat. Nos. 2,679,498 and 3,050,502;

negative-working reproduction layers comprising co-condensation products of aromatic diazonium compounds, for example according to DE-C 20 65 732 (=U.S. Pat. No. 3,867,147), which contain compounds possessing, in each case, at least one unit of a) a condensible aromatic diazonium salt compound and b) a condensible compound, such as a phenol ether or an aromatic thioether, connected by a divalent linking member derived from a condensible carbonyl compound, e.g. a methylene group.

The above-indicated photochemically acting radiation-sensitive or photosensitive layers are, in the first place, suitable for use in the preparation of multicolored proofs for analog imaging.

For imaging by means of digitally controlled exposure sources, for example laser beams, layer C must have a considerably higher photosensitivity. In this instance, therefore, C comprises a photosensitive layer composition of silver halides or, preferably, of highly photosensitive photopolymer formulations, as described in DE-A 37 10 281 (=U.S. Pat. No. 4,983,498) or in DE-A 38 32 032.

Radiation can be selected from the complete electromagnetic spectrum, including visible light, ultraviolet or infrared radiation, and electron emission. Preference is given to radiation in the ultraviolet region.

The radiation-sensitive recording material employed according to the present invention is prepared by conventional coating methods. The colored, thermally transferable layer B is applied to the temporary layer support in a thickness of 0.5 to 10 μm, preferably 1 to 5 μm, particularly preferably 1 to 3 μm, by extruding or coating from a solution and drying. To obviate or at least minimize interference with the subsequently applied radiation-sensitive layer C, coating is carried out either from strongly polar solvents, such as water, alcohols etc. or from relatively non-polar solvents, such as toluene, xylene, cyclohexane or pentane etc., depending upon the nature of the binder used.

A coating solution of the radiation-sensitive layer C is then applied on top of layer B in a thickness of 0.5 to 10 μm, preferably 1 to 5 μm, and dried. Preferred coating solvents include glycol ethers, ketones and esters. Another method of coating the radiation-sensitive layer C onto the thermally transferable layer B comprises laminating the layers together under appropriate conditions. To this end, the radiation-sensitive layer is applied separately from a solution to a temporary intermediate support. The intermediate support is, for example, a polyester film, such as a polyethylene terephthalate film, the surface of which has optionally been subjected to an appropriate dehesive pretreatment.

Apart from layers B and C which are required in the process, the recording material used according to the present invention can comprise further layers to control the processing steps. It is possible, for example, to have a release layer, e.g. of polyvinyl alcohol, disposed between the temporary layer support A and the thermally transferable layer B to facilitate the subsequent transfer of the colored image areas, the release layer remaining on the layer surface of A.

Between the colorant-containing, thermally transferable layer B and the radiation-sensitive layer C a barrier layer may be present, which prevents mixing together of the layers and/or migration of substances from one layer into the other.

Such barrier layers must be completely removable from the later image areas (uncovered areas of B) in the developing process of C. A radiation-sensitive layer C in the form of a photopolymer layer must necessarily have an oxygen barrier applied to it. The oxygen barrier can comprise a covering film of polyethylene or polyester or a polyvinyl alcohol-based covering layer.

As already mentioned above, the process of the present invention for preparing multicolored proofs in the four primary colors from the afore-described recording materials comprises the following process steps:

1. Imagewise exposing the colored film of primary color 1,
2. developing the exposed layer C to uncover the areas of B which are complementary to the remaining image areas of C (=C'),
3. contacting the coated side of the recording material thus prepared with the image receptor D and transferring the uncovered areas of B to the image receptor D, with the application of heat and pressure, the areas C' and the areas of B lying underneath remaining on the temporary support A,
4. repeating steps 1 to 3, using a colored film of primary color 2,
5. repeating steps 1 to 3, using a colored film of primary color 3,
6. repeating steps 1 to 3, using a colored film or primary color 4.

In the case of analog exposure of C through film masks, an image which is laterally reversed with respect to the image on the film mask is produced on the image receptor D.

In a particular embodiment of the process, the image receptor D is therefore used as an intermediate image receptor, on which the laterally reversed image is built up following steps 1 to 6. An additional step 7 is then carried out to transfer the complete color proof with heat and pressure to the permanent image receptor E, thus producing a color proof on E which is true to side with respect to the originally used film masks.

The process of the invention is used to prepare color proofs from color separations which are present in the form of negative films, positive films or digital data. When negative film originals are used in the imaging process, the formulation of the radiation-sensitive layer C is based on quinone diazide compounds as the photoreactive component and phenol-containing binders, for example novolaks, as known from positive-working photosensitive materials.

To prepare a multicolored proof starting from positive color separations the radiation-sensitive layer C comprises photocrosslinking systems, for example, diazonium salt polycondensation products, polymerizable monomers in combination with photoinitiators and/or sensitizers and polymeric binders.

For preparing a proof from digital data through direct laser imaging with laser light having a wavelength in the range from 350 to 850 nm, the radiation-sensitive layer C is based on silver halide chemistry or on the photopolymer system. If the preferred photopolymer layers are employed, the laser light source applicable is limited to wavelengths below 650 nm.

The colored layer B is transferred imagewise through the image mask C' to the support D, with the application of heat and pressure. Depending on the type of layer B, the temperature used in transferring the image varies between 50° and 150° C., preferably between 50° and 100° C. In the transfer process, pressure applied to the materials ranges from 0.1 to 1.0 kg/cm$^2$, preferably from 0.2 to 0.7 kg/cm$^2$.

The process of the present invention for preparing a multicolored proof has the advantage that, depending upon the respective embodiment, it yields a proof which can be produced by a positive, a negative or a digital method, without distorting the image thus generated by interjacent layers.

In the examples below, the procedures followed and the radiation-sensitive recording material required therefore are illustrated, without intending any limitation of the invention to these examples.

EXAMPLE 1

The colorant-containing, thermally transferable layers are prepared as follows: (The data given refer to weight percent, C. I.=Color Index)

|  | Cyan | Yellow | Magenta | Black |
|---|---|---|---|---|
| Ethylene-vinyl acetate copolymer (vinyl acetate content 23 to 30%, drop point 80° C.) | 9 | 9 | 9 | 9 |
| Blue pigment, C.I. 74 160 | 1 | — | — | — |
| Yellow pigment, C.I. 21 100 | — | 1 | — | — |
| Magenta pigment, C.I. 12 485 | — | — | 1 | — |
| Black pigment, PRINTEX 25 | — | — | — | 1 |
| Toluene | 90 | 90 | 90 | 90 |

Dispersions are prepared by grinding in a ball mill at 500 rev/minute for 50 minutes at a temperature of 40° C. and are then applied to a temporary layer support comprising a 50 μm thick polyethylene terephthalate film, with the aid of a coating knife and dried for 3 minutes at 100° C. The layer weight obtained is 2.6 g/m$^2$.

These dyed layers are then coated each with a radiation-sensitive layer having the following composition (pbw=part by weight):

1.5 pbw of an ester formed for m3 mols of 1,2-naphthoquinone-2-diazide-4-sulfonic acid chloride and 1 mol of 2,3,4-trihydroxybenzophenone,
6.9 pbw of an m-cresol/formaldehyde novolak (MW=6,000),
45.8 pbw of propylene glycol monomethyl ether,
45.8 pbw of tetrahydrofuran.

The dyed layers are spin-coated with the solution and dried for 2 minutes at 100° C. The dry weight of the photosensitive layer is 2.0 g/m$^2$.

The recording materials in the four primary colors are then exposed to the light of a 5 kW gallium-doped high-pressure mercury vapor lamp for an exposure time of 30 seconds under the corresponding color separation masks and developed separately in an aqueous-alkaline developer solution.

A first color proof dyed cyan is placed on an image receptor in the form of an image receptor film, in such a way that the transferable, colorant-containing layer components are in contact with the image receptor surface. A laminate is then prepared by passing the material through a laminator having a roller pair heated at 70° C., at a rate of 60 cm/min and under a pressure of 0.6 kg/cm$^2$.

After peeling off the temporary layer support, a laterally reversed, true reproduction of the original cyan color separation is obtained. The laminating step is repeated using the remaining primary colors and black, it being necessary to adjust the image positions in relation to one another in the process. As a result, a multicolored proof is obtained.

In an additional laminating step, the multicolored proof as a whole is transferred to an appropriate permanent image receptor comprising coated paper. This process step yields a multicolored proof which is true to side in relation to the original color separations.

EXAMPLES 2 to 5

The procedure described in Example 1 is followed with the exception that the colorant-containing, thermally transferable layer contains compounds as compiled in Table 1 below and that the material is laminated at the temperatures specified in each case.

TABLE 1

| Binder of the thermally transferable layer | Laminating temperature | Comments |
|---|---|---|
| 2 fatty acid alcohol (m.p. 48 to 50° C.) | 60° C. | |
| 3 fatty acid ester (m.p. 45 to 47° C.) | 60° C. | |
| 4 copolymer of styrene-butadiene (approx. 80% of styrene and 20% of butadiene) | 120° C. | photosensitive layer is also transferred |
| 5 polyvinyl acetate (MW = 110,000) | 80° C. | torn-out places in the colored layer |

EXAMPLE 6

Example 1 is repeated with the exception that the radiation-sensitive layer has the following composition:
5.9 pbw of tetraethylene glycol diacrylate, 16.9 pbw of a 34.4% concentration solution in butanone of a copolymer of methyl methacrylate and methacrylic acid, having an acid number of 190, 0.8 pbw of Samaron Navy Blue HR (manufacturer HOECHST AG), 0.6 pbw of dibenzal acetone, 0.6 pbw of 9-phenylacridine and 76.8 pbw of glycol monomethyl ether.

After applying a cover layer of polyvinyl alcohol (12% of residual acetyl groups, K-value 4, layer weight 2 g/m$^2$) which serves as an oxygen barrier, the recording materials are exposed to the light of a 5 kW gallium-doped high-pressure mercury vapor lamp for 30 seconds under the corresponding color separation masks and developed by stripping with an aqueous-alkaline solution.

EXAMPLE 7

Example 1 is repeated with the exception that the radiation-sensitive layer has the following composition:

2.9 pbw of a 34.8% concentration solution in butanone of a terpolymer of styrene, n-hexylmethacrylate and methacrylic acid (10:60:30) having an acid number of 190, 4.5 pbw of a 31% concentration solution in butanone of the product obtained by reacting triethanolamine with 3 mols of isocyanatoethyl methacrylate, 0.04 pbw of eosin, alcohol-soluble (C. I. 45 386), 0.03 pbw of 2,4-bis-trichloromethyl-6-(4-styrylphenyl)-s-triazine, 0.06 pbw of 9-phenylacridine, 0.2 pbw of 2,5-bis-(4-diethylamino-phenyl)-1,3,4-oxadiazole, 0.2 pbw of 4-dimethylamino-4'-methoxydibenzalacetone in 20.0 pbw of propylene glycol monomethyl ether.

After applying a cover layer of polyvinyl alcohol (12% of residual acetyl groups, K-value 4, layer weight 2 g/m$^2$), the recording material is exposed to the light of a 100 W incandescent lamp for 40 seconds under a 3 mm thick heat absorption glass filter (manufacturer SCHOTT) which absorbs wavelengths below 455 nm and then heated for 1 minute at 100° C. The radiation-sensitive layer is thereafter developed by stripping with an aqueous-alkaline solution.

Upon laminating, a laterally reversed, true reproduction of the original color separation is obtained.

EXAMPLE 8

Example 1 is repeated with the exception that the radiation-sensitive layer has the following composition:

8.9 pbw of a 34.8% concentration solution in butanone of a terpolymer of styrene, n-hexylmethacrylate and methacrylic acid (10:60:30), having an acid number of 190, 13.6 pbw of a 31% concentration solution in butanone of the product obtained by reacting triethanolamine with 3 mols of isocyanatoethylmethacrylate, 0.4 pbw of eosin, alcohol-soluble (C.1. 45 386), 0.03 pbw of 2,4-bis-trichloromethyl-6-(4-styrylphenyl)-s-triazine, 0.04 pbw of bis-(cyclopentadienyl)-bis-(pentafluoro-phenyl)-titan, in 77.03 pbw of propylene glycol monomethyl ether.

After applying a cover layer of polyvinyl alcohol 2% of residual acetyl groups, K-value 4, layer weight 2 g/m$^2$), the recording material is exposed to the light of a 100 W incandescent lamp for 40 seconds under a 3 mm thick heat absorption glass filter (manufacturer SCHOTT) which absorbs wavelengths below 455 nm and then heated for 1 minute at 100° C. The radiation-sensitive layer is then stripped with an aqueous-alkaline solution.

EXAMPLE 9

Example 1 is repeated with the exception that the radiation-sensitive layer has the following composition:

8.9 pbw of a 34.8% concentration solution in butanone of a terpolymer of styrene, n-hexylmethacrylate and methacrylic acid (10:60:30), having an acid number of 190, 13.6 pbw of a 31% concentration solution in butanone of the product obtained by reacting triethanolamine with 3 mols of isocyanatoethylmethacrylate, 0.4 pbw of eosin, alcohol-soluble (C. I. 45 386), 0.03 pbw of 2,4-bis-trichloromethyl-6-(4-styrylphenyl)-s-triazine, 0.04 pbw of bis-(cyclopentadienyl)-bis[2,6-difluoro-3-(pyrr-1-yl)phenyl]-titanium, in 77.03 pbw of propylene glycol monomethyl ether.

After applying a cover layer of polyvinyl alcohol 2% of residual acetyl groups, K-value 4, layer weight 2 g/m$^2$), the recording material is exposed to the light of a 100 W incandescent lamp for 40 seconds under a 3 mm thick heat absorption glass filter (manufacturer SCHOTT) which absorbs wavelengths below 455 nm and then heated for minute at 100° C. Thereafter, the radiation-sensitive layer is stripped or developed, respectively, by means of an aqueous-alkaline solution.

Upon laminating, a laterally reversed, true multicolored proof is obtained.

EXAMPLE 10

Example 1 is repeated with the exception that the radiation-sensitive layer has the following composition:

62 pbw of a polymer having an acid number of 40, prepared by reacting a polyvinylbutyral having a molecular weight of 70,000 to 80,000 and containing 71% of vinylbutyral units, 2% of vinylacetate units and 27% of vinylalcohol units with maleic anhydride, 21 pbw of a diazonium salt polycondensation product formed from 1 mol of 3-methoxydiphenylamine-4-diazonium sulfate and 1 mol of 4,4,-bis-methoxymethyl diphenylether in an 85% strength phosphoric acid and isolated as mesitylene sulfonate, 2.5 pbw of phosphoric acid (85%), 0.6 pbw of phenylazodiphenylamine in 2570 pbw of ethylene glycol monomethyl ether and 780 pbw of tetrahydrofuran.

The copying layer thus obtained which has a dry layer weight of 1.5 g/m$^2$ is exposed to the light of a 5 kW metal halide lamp for 30 seconds under a negative original and developed with an aqueous-alkaline solution. After laminating, the temporary layer support is peeled off to give a laterally reversed, sharp and true reproduction of the original color separation.

What is claimed is:

1. A process for preparing a multicolored proof comprising the steps of:
    a) exposing imagewise or radiation, a radiation-sensitive recording material which comprises a temporary, sheet-shaped layer support, coated with a thermally transferable layer containing a colorant in one primary color, a polymer or wax or mixture thereof, and in direct contact with the thermally transferable layer, a radiation sensitive layer;

b) developing the exposed radiation sensitive layer of said recording material with an aqueous-alkaline solution to uncover the thermally transferable image areas;

c) contacting the coated side of said recording material with an image receptor and transferring said transferable image areas to said image receptor, with the application of heat and pressure, to produce a partial image in the first primary color;

the repeating the above-described steps at least once, using a radiation-sensitive recording material which contains a colorant in another primary color in its thermally transferable layer.

2. The process according to claim 1, further comprising the step of transferring said multicolored proof, as a whole, to a permanent image receptor, with the application of heat and pressure.

3. The process according to claim 1, wherein a temperature in the range between 50° and 150° C. and a pressure in the range from 0.1 to 1.0 kg/cm² are used for transferring said transferable image areas.

4. The process according to claim 1, wherein said colorant-containing, thermally transferable layer has a softening range varying between about 50° and 150° C.

5. The process according to claim 1, wherein said radiation-sensitive layer, after exposing and, if appropriate, developing, yields a surface in image configuration, which has a softening range above 100° C.

* * * * *

UNITED STATES PATENT AND TRADEMARK OFFICE
CERTIFICATE OF CORRECTION

PATENT NO. : 5,223,374
DATED : June 29, 1993
INVENTOR(S) : MOHR et al.

It is certified that error appears in the above-indentified patent and that said Letters Patent is hereby corrected as shown below:

Column 10, line 62, Claim 1, "exposing imagewise or radiation," should read --exposing imagewise to radiation--.

Column 11, line 10, Claim 1, "the repeating the" should read --and repeating the--.

Signed and Sealed this

Fifth Day of July, 1994

Attest:

BRUCE LEHMAN

*Attesting Officer*     *Commissioner of Patents and Trademarks*